(12) United States Patent
Ulrich

(10) Patent No.: US 6,441,672 B1
(45) Date of Patent: Aug. 27, 2002

(54) CIRCUIT ARRANGEMENT FOR GENERATING THE CONTROL POTENTIAL FOR A FIELD-EFFECT TRANSISTOR

(75) Inventor: Theus Ulrich, Gundelfingen (DE)

(73) Assignee: Micronas GmbH (DE)

( * ) Notice: Subject to any disclaimer, the term of this patent is extended or adjusted under 35 U.S.C. 154(b) by 0 days.

(21) Appl. No.: 09/517,216

(22) Filed: Mar. 2, 2000

(30) Foreign Application Priority Data

Mar. 5, 1999 (DE) .......................................... 199 09 736

(51) Int. Cl.[7] .............................................. H03K 17/16
(52) U.S. Cl. .......................... 327/387; 327/391; 331/17; 331/175; 331/176
(58) Field of Search ................................ 327/157, 540, 327/541, 542, 543, 545, 546, 548, 379, 384, 387, 389, 391, 551; 331/16, 17, 34, 175, 176, 185

(56) References Cited

U.S. PATENT DOCUMENTS

| | | |
|---|---|---|
| 4,559,505 A | 12/1985 | Suaréz et al. |
| 5,036,295 A * | 7/1991 | Kamitani ..................... 331/14 |
| 5,144,156 A | 9/1992 | Kawasaki |
| 5,319,320 A * | 6/1994 | Abe et al. ..................... 331/14 |
| 5,523,724 A * | 6/1996 | Assar et al. ................... 331/14 |
| 5,889,439 A * | 3/1999 | Meyer et al. ................ 327/156 |

FOREIGN PATENT DOCUMENTS

| | | |
|---|---|---|
| DE | 19634084 A1 | 2/1998 |
| DE | 19713058 A1 | 4/1998 |

* cited by examiner

Primary Examiner—Timothy P. Callahan
Assistant Examiner—Terry L. Englund
(74) Attorney, Agent, or Firm—Harness, Dickey & Pierce, P.L.C.

(57) ABSTRACT

An explanation is given of a circuit arrangement for generating the control potential for a field-effect transistor from the output voltage (VA) of a filter circuit (20). In order to reduce the noise component thereof, the output terminal (A) of the filter circuit (20) is connected to a capacitive voltage divider (C1, C2), the tap of which carries the control potential. It is possible to control the charge state of the voltage divider (C1, C2) for the purpose of setting a predetermined potential value at the tap (10).

33 Claims, 2 Drawing Sheets

CIRCUIT ARRANGEMENT FOR GENERATING THE CONTROL POTENTIAL FOR A FIELD-EFFECT TRANSISTOR

The invention relates to a circuit arrangement for generating the control potential for a field-effect transistor from the output voltage of a filter circuit.

A filter circuit is used for generating the control potential for a field-effect transistor if the quantity which determines the control potential is available in the form of current pulses. Deriving the control potential from these current pulses requires a filter circuit which contains a capacitance element and smoothes the current pulses by charging the capacitance element. A filter output voltage is then produced across the capacitance element and supplies the control potential for the field-effect transistor. Such a principle is employed e.g. in phase locked loops whose oscillator is controlled at the control electrode of a field-effect input transistor.

The stability of the functioning of a phase locked loop. requires that the filter circuit additionally contains a resistor as well as capacitors. The thermal noise of this resistor determines the phase noise of the oscillator if the filter circuit is designed with such a high impedance as is advantageous, in accordance with the high input impedance of the field-effect transistor, in the sense of a small area requirement in integrated circuitry. If the resistance is reduced in order to reduce the noise, then the capacitors increase in size in the same ratio and can then no longer be integrated cost-effectively.

One possible way of circumventing this problem, in particular in the case of LC oscillators, is for the control characteristic curve of the oscillator to have the flattest possible profile. Thus, for example in FM tuning circuits, it is customary to adjust the frequency by only 20% with a voltage swing of 30 volts. This requires special trimming of the oscillator, since this adjustment range does not include the production tolerances.

In integrated circuits, RC oscillators or multivibrators are customary which, on account of miniaturization, permit only operating and tuning voltages of at most 5 volts and are intended to have a wide adjustment range which, in addition to the required frequency range, is also intended to include the production tolerances as well. A large slope of the control characteristic curve of the oscillator is then unavoidable.

Phase locked loops are disclosed in the published German patent applications DE 196 34 084 A1 and DE 197 13 058 A1. In the case of the phase locked loop of DE 196 34 084 A1, a capacitive voltage divider is used for suppressing interference signals. Two diodes with mutually opposite forward directions are connected in parallel with one capacitor of the voltage divider. During on-state operation, one of the diodes bridges the capacitor, with the result that the current flowing at the output of the filter circuit is used as charge-reversal current in the ratio 1:1. The output voltage of the filter circuit is passed to a capacitive voltage divider, the tap of which carries the control potential. The fact that the phase locked loop changes its transfer properties when one of the diodes bridges the capacitor of the voltage divider is disadvantageous.

The object of the invention is to specify, for generating the control potential for a field-effect transistor using a capacitive voltage divider, an improved circuit arrangement.

In the case of the invention, while a prescribed upper or lower filter output voltage is respectively exceeded or undershot, a current branch connected to the filter output can be activated, which loads the filter output with a current which respectively reduces or raises the filter output voltage. The current ratio between charge-reversal current and the current in the current branch connected to the filter output is dimensioned in such a way that the ratio between a current at the input or output of the filter circuit and the change in the potential at the tap of the voltage divider has approximately the same value in all operating modes of the circuit arrangement.

The current flow in the current branch connected to the filter output prevents the circuit which drives the filter from departing from its permissible output voltage range. To ensure, however, that the voltage at the tap of the voltage divider is nevertheless adjusted as if the voltage at the filter output were unlimited, part of the current, which is opposite in sign for compensation, is forwarded into the tap, such that the latter is adjusted as far as possible independently of whether or not the filter output voltage has reached a limit value. As a result, the adjustable voltage range at the tap is substantially greater than the range which corresponds to the possible variation of the filter output voltage.

The above-mentioned problem is solved in a second aspect of the invention by a circuit arrangement having the features indicated in claim 2. This circuit arrangement also serves to generate the control potential for a field-effect transistor from the output voltage of a filter circuit. The output voltage of the filter circuit is passed to a capacitive voltage divider, the tap of which carries the control potential. In addition to the control by means of the filter output voltage, the charge state of the voltage divider can be controlled for the purpose of setting a predetermined potential value relative to the reference-ground potential of the field-effect transistor by a charge-reversal current being fed in at the tap of the voltage divider, until the predetermined potential value is reached. The filter output voltage is detected and a circuit which supplies the charge-reversal current is activated in the event of the filter output voltage deviating from at least one prescribed value. In the case of the circuit according to the second aspect of the invention, the predetermined value is strictly determined relative to ground potential and/or a supply potential. In other words, the predetermined value is fixed relative to ground and/or a supply potential.

The circuits according to both aspects are combined with each other in developments of the invention.

The charge-reversal current and the current in the current branch connected to the filter output are in a prescribed current ratio which is less than 1:10, preferably approximately 1:1000. While the current in the current branch connected to the filter output should be in the microamperes range, for example, in order to prevent undesirably large charge-reversal processes at the capacitive voltage divider, a current to be fed in at the tap of a few nanoamperes suffices for correcting the control potential for the field-effect transistor in the manner described above.

The n-channel charge-reversal circuit in the development in accordance with claim 7 may contain two current branches similar to a current mirror, in which the operating path terminals of their two transistors are not connected to one another. One operating path terminal is at a first fixed potential; the other operating path terminal is connected to the filter output. As a result, the current mirror becomes active only when the potential at the filter output reaches the first fixed potential. The first current branch of the n-channel charge-reversal circuit determines the current flow in the current branch connected to the filter output. The second current branch determines the charge-reversal current at the tap of the capacitive voltage divider.

The use of the same transistor, which is at the fixed potential, for both current mirror-like current branches enables components to be saved. The prescribed current ratio between charge-reversal current and current in the current branch at the output of the filter circuit is made possible by a resistor. In order to reduce the current ratio further, the width/length ratio of the channels in the transistors of the two current mirror-like current branches may also differ.

In the embodiment according to claim 8, the charge-reversal circuit likewise has two current branches similar to a current mirror. In this case, one operating path terminal of one transistor is at a second fixed potential. The operating path terminal of the other transistor is connected to the output of the filter circuit. The circuit arrangement operates as a current mirror as soon as the potential at the output of the filter circuit reaches the second fixed potential. The charge-reversal circuit additionally contains two series-connected current mirror arrangements, the connection of which to the tap of the capacitive voltage divider enables the charge-reversal current to be fed in. In order to obtain the prescribed current ratio between charge-reversal current and current in the current branch connected to the filter output, a further resistor is used, which is arranged in the output current branch of the second current mirror and is fed with a prescribed current.

An exemplary embodiment of the invention is explained below with reference to the drawings, in which.

Figure 1:
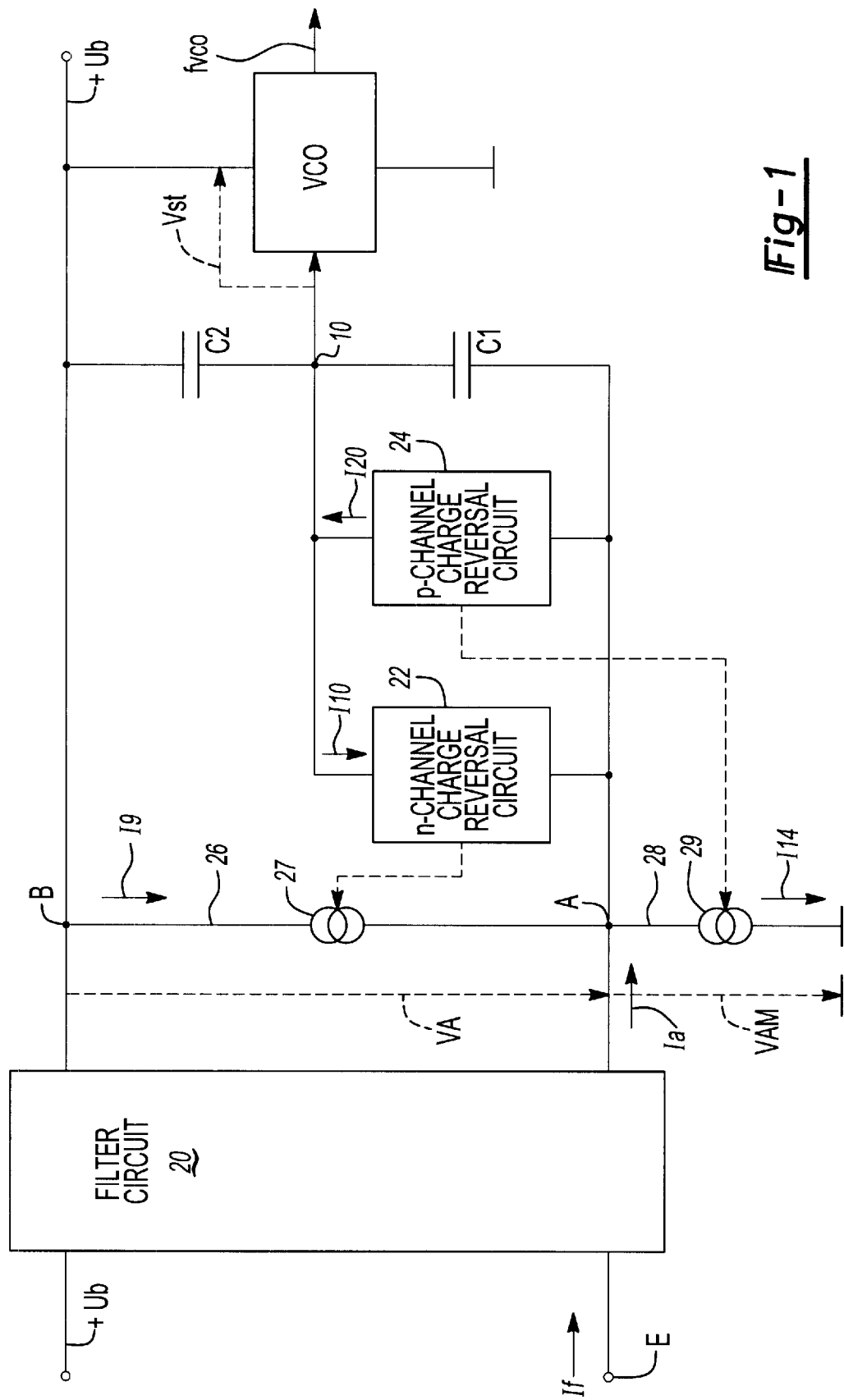
FIG. 1 shows a basic circuit diagram.

The circuit arrangement shown in FIG. 1 is part of a PLL regulating loop (not illustrated) with which a phase-locked coupling of two signals is intended to be produced. An actual signal fvco is output by a voltage-controlled oscillator VCO, whose control input—for example a p-channel transistor—is connected at the output of the circuit arrangement between the positive operating voltage potential +Ub and the tap 10 of a capacitive voltage divider comprising capacitance elements C1 and C2 and which is connected to ground potential as reference-ground potential. In a comparison circuit (not illustrated) of the PLL regulating loop, the actual signal fvco is compared, as the measured quantity, with a prescribed desired signal as the reference quantity. Depending on the phase difference between the two signals, a current pulse train If is generated at the output of the comparison circuit. The longer the current pulses which occur per unit time of e.g. 1 millisecond, the greater is the phase deviation of the two signals. If the phase of the actual signal fvco leads with respect to the phase of the desired signal, then the current pulses If of the comparison circuit have a first direction. If, on the other hand, the phase of the actual signal fvco lags with respect to the phase of the desired signal, then said current pulses have the opposite direction.

A filter circuit 20. contains capacitance elements and smoothes the current pulse train If. Between the output terminals A and B of the filter circuit 20, a smoothed filter output voltage VA is produced, and, if appropriate, a smoothed trimming current Ia can flow. If necessary, also the filter output voltage VAM, which is referred to ground, is used in the description.

The filter output voltage VA is divided at the capacitive voltage divider, the capacitance ratio of which is dimensioned in such a way that at its tap 10, a control potential for the input transistor of the VCO appears which reduces the gate-source voltage thereof to approximately 1% relative to the high-frequency signal components of the filter output voltage VA. The above-described interference component is then also reduced by the same ratio. Exemplary values for C1 and C2 are 0.4 pF and 40 pF.

The circuit arrangement shown in FIG. 1 contains a current branch 26 which is connected in parallel with the filter output and which feeds a current I9 into the output terminal A and hence into the input of the capacitive voltage divider if it is closed by a controlled current source 27. The latter is driven, in a manner yet to be described, by an n-channel charge-reversal circuit 22, which can draw a current I10 from the tap 10 of the voltage divider.

A further current branch 28 is connected between the filter output terminal A and ground potential and draws a current I14 from the output terminal A and hence from the input of the capacitive voltage divider C1, C2 if a controlled current source 29 is activated. The latter is driven, in a manner yet to be described, by a p-channel charge-reversal circuit 24, which can feed a current I20 to the tap 10 of the voltage divider.

The circuit arrangement shown in FIG. 1 operates as follows:

If the n-channel charge-reversal circuit 22 and the p-channel charge-reversal circuit 24 are de-energized, no current is fed in at the tap 10, nor is any current drawn from it. The current branch 26 and the current branch 28 are then likewise de-energized. This state corresponds to the normal operating mode of the regulating loop, in which the two signals mentioned above correspond.

If the filter output voltage VAM linked to the filter. output A then falls below a prescribed value, e.g. one third of the operating voltage +Ub relative to ground potential, then the n-channel charge-reversal circuit 22 becomes active. The n-channel charge-reversal circuit 22 activates the current branch 26, with the result that a current I9 with the same direction as the output current of the filter circuit 20 can flow in the node A, which, via the series-connected capacitance elements C1, C2, would effect a change in the filter output voltage and hence also in the potential at the filter output A. However, the charge-reversal circuit 22 draws a current I10 from the tap 10, which current flows in parallel with the partial capacitance element C1 and counteracts a change in potential at the tap 10. The current I9 in the current branch 26 connected in parallel with the filter circuit 20 can be dimensioned in such a way that a sudden voltage change, e.g. in the event of the changeover of the operating frequency of the PLL regulating loop, does not let the filter output voltage VAM fall below the above-mentioned value. If the oscillator VCO has found its new operating point on account of the current I10, then the filter output voltage VAM again lies above the prescribed value, and the n-channel charge-reversal circuit is de-energized. The charge state of the capacitance elements C1, C2 that is then present is maintained.

In the event of a voltage change in the filter output voltage VA or VAM, respectively, in the opposite direction—that is to say a rise in the potential at the filter output A—the p-channel charge-reversal circuit 24 becomes active as soon as the voltage VAM reaches an upper prescribed value, e.g. two thirds of the operating voltage +Ub. The p-channel charge-reversal circuit 24 drives the current branch 28, with the result that a current I14 flows to ground therein. A current I20 is fed in at the tap 10 in order to maintain the potential there. The current I14 is dimensioned in such a way that the filter output voltage falls below the upper prescribed value. If the oscillator VCO has found its new operating point, then the p-channel charge-reversal circuit 24 is de-energized. The charge state of the capacitance elements C1 and C2 that is then present is maintained.

Figure 2:
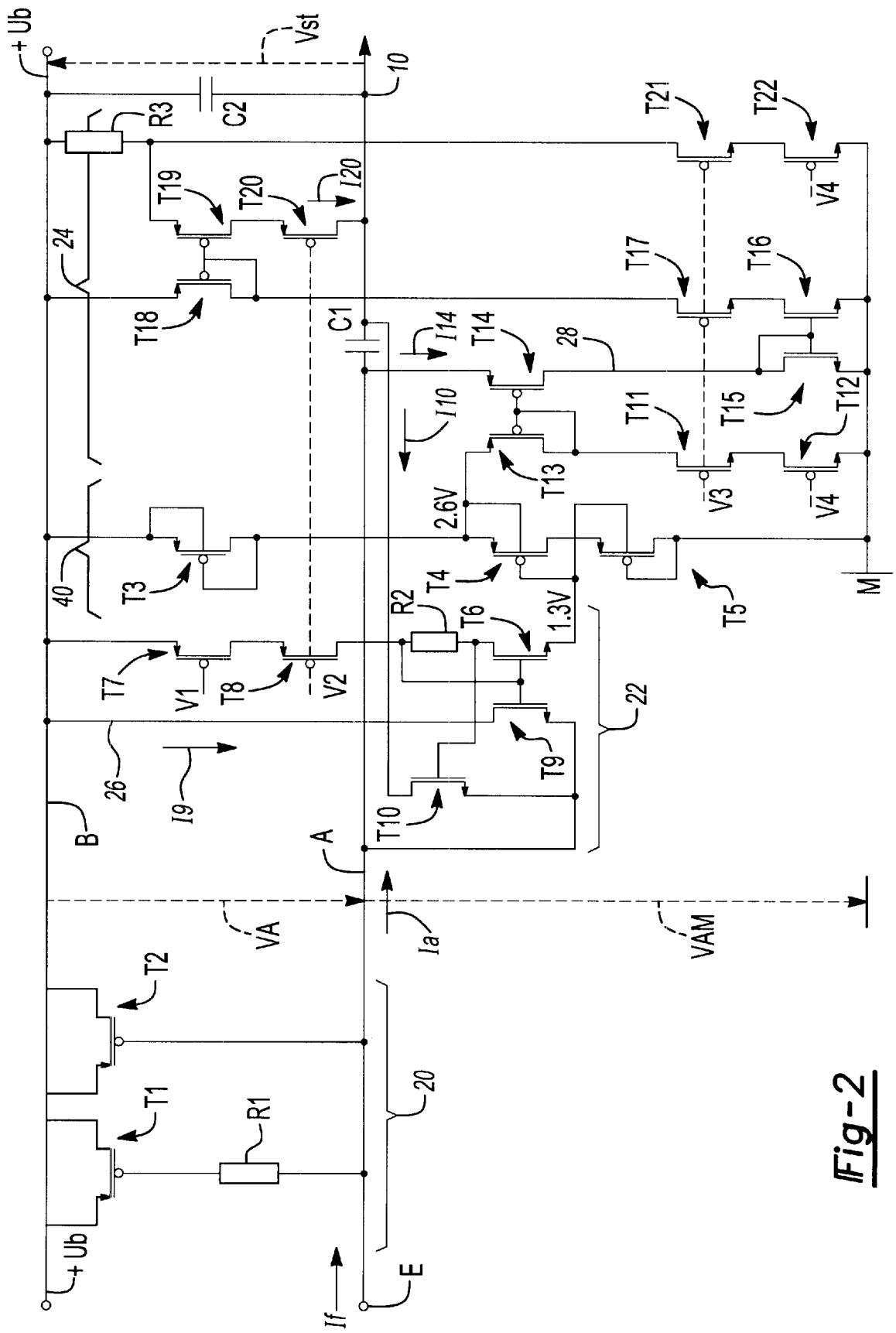
FIG. 2 shows a circuit arrangement which is suitable for construction using integrated MOS technology.

FIG. 2 shows a circuit arrangement using integrated MOS technology which operates according to the principle illustrated in FIG. 1. The filter circuit 20 contains a resistor R1, one of whose terminals is connected to the input terminal E and the other of whose terminals is connected to a p-channel field-effect transistor T1, which is connected to positive operating voltage potential and is connected as a gate oxide capacitor. A p-channel field-effect transistor T2, which is likewise connected as a gate oxide capacitor, is connected in parallel with the series circuit formed by the resistor R1 and the transistor T1.

The output terminal A of the filter circuit 20 is connected to one terminal of the capacitor C1. The other terminal of the capacitor C1 forms the tap 10 of the capacitive voltage divider comprising the capacitor C1 and the capacitor C2 connected to the positive. operating voltage potential +Ub. The control potential Vst for the oscillator VCO appears at the tap 10 of the capacitive voltage divider C1, C2.

In the right-hand part, the circuit arrangement contains a voltage divider 40 connected between the positive operating voltage potential +Ub and ground potential M. This voltage divider contains three series-connected p-channel field-effect transistors T3, T4 and T5, which are connected as resistors of the same value. To that end, at the transistors T3, T4 and T5, the gate terminal is in each case connected to the drain terminal. The substrate terminal is in each case connected to the source terminal. The source terminal of the transistor T3 is connected to the positive operating voltage potential +Ub. The drain terminal of the transistor T3 is connected to the source terminal of the transistor T4. The drain terminal of the transistor T4 is connected to the source terminal of the transistor T5. The drain terminal of the transistor T5 is connected to ground potential.

The n-channel charge-reversal circuit 22 contains transistors T6 to T10. The transistors T7 and T8 are p-channel field-effect transistors. The transistors T6, T9 and T10 are n-channel field-effect transistors. The source terminal of the transistor T6 is connected to the drain terminal of the transistor T4 and is thus connected to a fixed potential of approximately one third of the operating voltage Ub, that is to say to 1.3 volts relative to ground potential in the case of an operating voltage of 4 volts. The drain terminal of the transistor T6 is connected to a current branch in which a prescribed current is generated with the aid of the transistors T7 and T8. To that end, the source terminal of the transistor T7 is connected to the positive operating potential +Ub. The transistor T8 forms a cascade circuit with the transistor T7. The drain terminal of the transistor T8 is connected to one terminal of a resistor R2, which likewise belongs to the n-channel charge-reversal circuit 22, and to the gate terminals of the transistors T6 and T9. The other terminal of the resistor R2 is connected to the drain terminal of the transistor T6 and to the gate terminal of the transistor T10. The source terminals of the transistors T9 and T10 are connected to the output terminal A of the filter circuit 20. The drain terminal of the transistor T9 is connected to the positive operating potential +Ub, with the result that it is connected in parallel with the filter output. The drain terminal of the transistor T10 is connected to the tap 10 of the capacitive voltage divider C1, C2, with the result that the operating path of the transistor T10 is connected in parallel with the capacitance element C1.

The gate terminal of the transistors T7 and T8 is supplied with a control potential V1 and V2, respectively, which, on the one hand, allows a drain current of the magnitude of the maximum permissible filter output current Ia to flow in the transistors T7, T8 and the temperature response of which, on the other hand, is chosen such that the voltage across the resistor R2, at any operating temperature, has a value which ensures that the current mirroring ratio in the two circuit arrangements operating like current mirrors and comprising the transistors T6 and T9, and T6 and T10, respectively, remains the same irrespective of the operating temperature. The n-channel charge-reversal circuit 22 is designed in such a way that the drain currents of the transistors T10 and T9 have a ratio of 1: 1000.

The p-channel charge-reversal circuit 24 contains transistors T11 to T22. The transistors T13, T14 and T18 to T20 are p-channel field-effect transistors. The transistors T11, T12, T15 to T17, T21 and T22 are n-channel field-effect transistors. The source terminal of the transistor T13 is connected to the drain terminal of the transistor T3 and is thus connected to a fixed potential of approximately 2.6 volts relative to ground potential in the case of an operating voltage of 4 volts. The drain terminal of the transistor T13 is connected to the gate terminal thereof, to the gate terminal of the transistor T14 and to the drain terminal of the transistor T11, which forms a cascode circuit with the transistor T12. The source terminal of the transistor T12 is connected to ground potential. The source terminal of the transistor T14 is connected to the output terminal A of the filter circuit 20. The drain terminal of the transistor T14 is connected to a current mirror circuit comprising the transistors T15, T16 and T17. In this current mirror circuit, the transistor T15 operates as a diode, for which purpose its gate terminal and its drain terminal are connected. The gate terminals of the transistors T15 and T16 are connected. In addition, the source terminals of the transistors T15 and T16 are connected to ground potential. The transistors T16 and T17 form a cascode circuit, with the result that the drain terminal of the transistor T16 is connected to the source terminal of the transistor T17. The mirror ratio of the currents in the current mirror comprising the transistors T15 to T17 is approximately 1:1.

A further current mirror comprising the transistors T18 to T20 is connected in series with the current mirror comprising the transistors T15 to T17. To that end, the drain terminal of the transistor T17 is connected to the drain terminal of the transistor T18. The transistor T18 operates as a diode, so that its drain terminal is also connected to its gate terminal. The source terminal of the transistor T18 is connected to the positive operating voltage potential +Ub. The gate terminal of the transistor T18 is additionally connected to the gate terminal of the transistor T19, which forms a cascade circuit with the transistor T20. The source terminal of the transistor T19 is connected to one terminal of a resistor R3 and to the drain terminal of the transistor T21. The other terminal of the resistor R3 is connected to the positive operating potential +Ub. The drain terminal of the transistor T20 is connected to the tap 10 of the capacitive voltage divider C1, C2. The gate terminal of the transistor T20 is connected to the fixed potential V2.

The transistor T21 forms a cascade circuit with the transistor T22, the source terminal of the transistor T22 being connected to ground potential. The gate terminals of the transistors T11, T17 and T21 are connected to a fixed potential V3, and the gate terminals of the transistors T12 and T22 are connected to a fixed potential V4. The fixed potentials V3 and V4 have a temperature response which enables identical current mirror ratios in the current mirrors T15 to T17 and T18 to T20, irrespective of the operating temperature. In particular, the fixed potentials V3 and V4 have a temperature response which changes the voltage drop across the resistor R3 in such a way that the current mirror T18 to T19 has a constant current mirror ratio of approximately 1000:1 between input current and output current, irrespective of the operating temperature.

The function of the n-channel charge-reversal circuit 22 shall. be explained below. The transistors T6 and T9 form a first current mirror-like circuit which differs from known current mirror circuits by virtue of the fact that the source terminals of the transistors T6 and T9 are not connected. The effect achieved as a result of this is that the circuit comprising .the transistors T6 and T9 becomes active only when the potential at the filter output A falls below the prescribed value of 1.3 volts at the source terminal of the transistor T6. It is only at this value of the potential of the filter output A that the drain current of the transistor T9 has a value which corresponds approximately to the drain current of the transistor T6. If the filter output voltage VAM falls further, then a correspondingly larger drain current I9 is produced.

The transistors T6 and T10 likewise form such a current mirror-like circuit. However, on account of a smaller gate-source voltage in comparison with the gate-source voltage of the transistor T9, the drain current of the transistor T10 is substantially smaller than the drain current I9 in the transistor T9. In other words, while the currents I9 and I10 in the n-channel charge-reversal circuit 22 are negligibly small in the normal operating state, they have the prescribed values in the event of an exceeding of the limit value of the filter output voltage VA. The current I10 is dimensioned in such a way that it rises as the potential of the filter output A decreases. Consequently, the potential at the tap 10 changes to a greater extent if the potential at the filter output A falls to a greater extent below the value of 1.3 volts. This enables rapid and precise regulation of the potential at the tap 10 in comparison with the tapping off of a constant current. The current I9 likewise increases as the filter output voltage VAM decreases, with the result that the ratio of I9 and I10 is ensured over the entire modulation range.

In order that the n-channel transistor T10 is controlled only by the output A of the filter circuit, and not by the tap 10 of the voltage divider, the tap 10 must be positively biased with respect to the output A. If that is not possible, a circuit after the manner of the p-channel charge-reversal circuit must be used in a complementary manner for the n-channel charge-reversal circuit as well.

The p-channel charge-reversal circuit 24 operates in a similar manner. However, it is intended to feed in a charging current I20 at the tap 10 of the capacitive voltage divider C1, C2. An increase in potential is therefore necessary, which is effected with the aid of the two current mirrors T15 to T17 and T18 to T20. The transistors T13 and T14 likewise form a current mirror-like circuit which operates when the fixed potential value of 2.6 volts that is present at the source terminal of the transistor T13 is exceeded. The current I20 is fed in at the tap 10 in order to raise the potential at the tap 10.

If the potential at the filter output A falls below the upper fixed potential value, the currents I14 and I20 become negligibly small, since the p-channel charge-reversal circuit 24 is again in the idle state.

The capacitance element C2 has only approximately one tenth of the capacitance of the capacitance element formed by the transistor T1. In the case of a voltage divider ratio in the capacitive voltage divider C1 and C2 of 100:1 and the above-mentioned current ratio of 1000:1, it is ensured that the ratio of the current If or Ia, respectively, to the change in the potential at the tap 10 has approximately the same value in all operating modes of the circuit arrangement. This leads to a good regulating behavior in a PLL regulating loop.

In another embodiment, a charge-reversal circuit which is complementary to the p-channel charge-reversal circuit 24 is used instead of the n-channel charge-reversal circuit 22. That means that n-channel transistors are used instead of p-channel transistors. Instead of n-channel transistors, p-channel transistors are used. Further, transistors which are connected to ground in the p-channel charge-reversal circuit 24 are connected to the positive supply voltage +Ub. Transistors which are connected to the positive supply voltage +Ub in FIG. 2 are connected to ground potential in the charge-reversal circuit 22 in this embodiment. In the case of the transistor T6 shown in FIG. 2, the charge-reversal circuit 22 would then have a current branch with prescribed current flow in the operating path of the. transistor T6. One of the operating path terminals of the transistor T6 would still be at the fixed potential of 1.3 volts. The control terminal of the transistor T6 would be connected to the other operating path terminal and to the control terminal of the transistor T9. One of the operating path terminals of the transistor T9 would, as is the case in FIG. 2, be connected to one output terminal A of the filter circuit 20. The other operating path terminal of the transistor T9 would be connected to the input current branch of two series-connected current mirror circuits. The output current branch of the second current mirror circuit would be connected to the tap 10 of the voltage divider C1, C2 directly and to the ground potential via; a further resistor, which is fed with a prescribed current from a further current branch.

What is claimed is:

1. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant.

2. The circuit arrangement as claimed in claim 1, wherein the current ratio is a predetermined current ratio of less than 1:10 between the charge reversal current and the current in the current branch.

3. The circuit arrangement as claimed in claim 1, wherein the charge reversal circuit provides the charge-reversal current in a direction determined by a direction in which the control potential is to be adjusted toward a setting value.

4. The circuit arrangement as claimed in claim 1, wherein the charge reversal circuit comprises an n-channel charge-reversal circuit comprising a resistor and first, and second third transistors, the first transistor comprising a first operating path terminal at a fixed potential, the resistor comprising a first terminal connected to a second operating path terminal of the first transistor and to a control terminal of the second transistor, the second transistor comprising an operating path connected to the filter output node and to the tap of the capacitive voltage divider, and wherein the resistor further comprises a second terminal connected to a control terminal of the first transistor and to a control terminal of the third transistor, the third transistor comprising an operating path connected to the filter circuit output voltage.

5. The circuit arrangement as claimed in claim 1, wherein the charge reversal circuit comprises first and second transistors and two series-connected current mirror circuits comprising first and second current mirror circuits;
  wherein the first transistor comprises first and second operating path terminals, the first operating path terminal being at a fixed potential, the first transistor further comprising a control terminal connected to the second operating path terminal thereof and to a control terminal of the second transistor;
  wherein a first operating path terminal of the second transistor is connected to the filter output node and a second operating path terminal of the second transistor is connected to an input current branch of the current mirror circuits, and wherein an output current branch of the second current mirror circuit is connected to the tap of the capacitive voltage divider and at least one of (a) a second filter circuit output node and (b) a ground terminal via a resistor fed with current via a current-feeding branch.

6. The circuit arrangement as claimed in claim 1, wherein the filter circuit comprises a loop filter in a phase locked loop, and wherein the field-effect transistor is an input transistor of a voltage-controlled oscillator of a phase regulating circuit.

7. The circuit arrangement as claimed in claim 1, further comprising an operating voltage between a supply potential and a ground potential, and wherein the fixed magnitudes comprise at least one of one third of the operating voltage and two thirds of the operating voltage.

8. The circuit arrangement as claimed in claim 1, further comprising a second voltage divider that provides one of the fixed magnitudes.

9. The circuit arrangement as claimed in claim 1, wherein the capacitive voltage divider capacitively divides the output voltage of the filter circuit at least in the ratio of 10:1.

10. The circuit arrangement as claimed in claim 9, wherein the voltage ratio is 100:1.

11. The circuit arrangement as claimed in claim 1, wherein the fixed magnitudes comprise positive voltages.

12. The circuit arrangement as claimed in claim 2, wherein the charge reversal current and the current in the current branch connected to the filter output are in a prescribed current ratio which is approximately 1:1000.

13. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:
  a charge reversal circuit connected to the tap that provides a charge-reversal current at the tap if the filter output voltage deviates from atleast one of a fixed upper filter output voltage magnitude and a fixed lower filter output voltage magnitude, the charge reversal circuit configured to provide the charge-reversal current until the control potential reaches a predetermined potential value at the tap; and
  wherein the at least one fixed magnitude is fixed relative to a ground potential and/or a supply potential.

14. The circuit arrangement as claimed in claim 13, further comprising a current branch connected to a filter output node for providing at the node, while the filter output voltage deviates from at least one of the magnitudes, a current that alters the filter output voltage so as to counteract the deviation.

15. The circuit arrangement as claimed in claim 14, wherein a current ratio between the charge-reversal current and the current in the current branch connected to the filter output node is dimensioned such that a ratio between a current entering or leaving the filter circuit and a change in the control potential at the tap is approximately constant.

16. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:
  a charge reversal circuit connected to the tap that provides a charge-reversal current at the tap if the filter output voltage deviates from at least one of a fixed upper filter output voltage magnitude and a fixed lower filter output voltage magnitude; and
  a current branch connected to a filter output node for providing at the node, while the filter output voltage deviates from at least one of the magnitudes, a current that alters the filter output voltage so as to counteract the deviation;
  wherein a current ratio between the charge-reversal current and the current in the current branch is dimensioned such that a ratio between a current entering or leaving the filter circuit and a change in the control potential at the tap is approximately constant;
  wherein the current ratio is a predetermined current ratio of less than 1:10 between the charge reversal current and the current in the current branch.

17. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:
  a charge reversal circuit connected to the tap that provides a charge-reversal current at the tap if the filter output voltage deviates from at least one of a fixed upper filter output voltage magnitude and a fixed lower filter output voltage magnitude; and
  a current branch connected to a filter output node for providing at the node, while the filter output voltage deviates from at least one of the magnitudes, a current that alters the filter output voltage so as to counteract the deviation;
  wherein a current ratio between the charge-reversal current and the current in the current branch is dimensioned such that a ratio between a current entering or leaving the filter circuit and a change in the control potential at the tap is approximately constant;
  wherein the charge reversal circuit provides the charge-reversal current in a direction determined by a direction in which the control potential is to be adjusted toward a setting value.

18. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:
  a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant;

wherein the charge reversal circuit comprises an n-channel charge-reversal circuit comprising a resistor and first, second and third transistors, the first transistor comprising a first operating path terminal at a fixed potential, the resistor comprising a first terminal connected to a second operating path terminal of the first transistor and to a control terminal of the second transistor, the second transistor comprising an operating path connected to the filter output node and to the tap of the capacitive voltage divider, and wherein the resistor further comprises a second terminal connected to a control terminal of the first transistor and to a control terminal of the third transistor, the third transistor comprising an operating path connected to the filter circuit output voltage.

19. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant;

wherein the charge reversal circuit comprises first and second transistors and two series-connected current mirror circuits comprising first and second current mirror circuits;

wherein the first transistor comprises first and second operating path terminals, the first operating path terminal being at a fixed potential, the first transistor further comprising a control terminal connected to the second operating path terminal thereof and to a control terminal of the second transistor;

wherein a first operating path terminal of the second transistor is connected to the filter output node and a second operating path terminal of the second transistor is connected to an input current branch of the current mirror circuits, and wherein an output current branch of the second current mirror circuit is connected to the tap of the capacitive voltage divider and at least one of (a)

a second filter circuit output node and (b) a ground terminal via a resistor fed with current via a current-feeding branch.

20. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant; wherein the filter circuit comprises a loop filter in a phase locked loop, and wherein the field-effect transistor is an input transistor of a voltage-controlled oscillator of a phase regulating circuit.

21. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant;

the circuit arrangement further comprising an operating voltage between a supply potential and a ground potential, and wherein the fixed magnitudes comprise at least one of one third of the operating voltage and two thirds of the operating voltage.

22. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant;

the circuit arrangement further comprising a second voltage divider that provides one of the fixed magnitudes.

23. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant; and wherein the capacitive voltage divider capacitively divides the output voltage of the filter circuit in a ratio of 100:1.

24. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude; and a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant; and wherein the fixed magnitudes comprise positive voltages.

25. A circuit arrangement for generating a control potential for a field-effect transistor from an output voltage of a filter circuit, in which the output voltage of the filter circuit is passed to a capacitive voltage divider having a tap that carries the control potential, the circuit arrangement comprising:

a charge reversal circuit connected to the tap that provides a charge-reversal current at the tap if the filter output voltage deviates from at least one of a fixed upper filter output voltage magnitude and a fixed lower filter output voltage magnitude, the charge reversal circuit configured to. provide the charge-reversal current until the control potential reaches a predetermined potential value at the tap; and wherein the at least one fixed magnitude is fixed relative to a ground potential and/or a supply potential;

the circuit arrangement further comprising a current branch connected to a filter output node for providing at the node, while the filter output voltage deviates from at least one of the magnitudes, a current that alters the filter output voltage so as to counteract the deviation;

wherein a current ratio between the charge-reversal current and the current in the current branch is dimensioned such that a ratio between a current entering or leaving the filter circuit and a change in the control potential at the tap is approximately constant.

26. A method for generating a control potential for a field-effect transistor from an output voltage of a filter circuit, in which the output voltage of the filter circuit is passed to a capacitive voltage divider having a tap that carries the control potential, the method comprising the steps of:

controlling a charge state of the capacitive voltage divider to set the control potential to a predetermined potential value using a charge-reversal current at the tap, until the predetermined potential value is reached;

if the filter output voltage deviates from at least one of a fixed upper filter output voltage magnitude and a fixed lower filter output voltage magnitude, supplying the charge-reversal current at the tap; and altering the filter output voltage so as to counteract the deviation.

27. The method of claim 26 wherein the altering step comprises loading a filter output node with a current via a current branch connected to the node.

28. The method of claim 27 further comprising the step of maintaining an approximately constant ratio between a current entering or leaving the filter circuit and a change in the control potential at the tap, said step performed using a current ratio between the charge-reversal current and the current in the current branch.

29. The method of claim 26 further comprising the step of adjusting the control potential at the tap within a range greater than a range corresponding to possible variation of the filter output voltage.

30. The method of claim 26 further comprising the step of predetermining the potential value relative to a reference-ground potential for the field-effect transistor.

31. The method of claim 26 further comprising the step of detecting the filter output voltage.

32. The method of claim 26 further comprising the step of fixing the filter output voltage magnitudes based on at least one of a supply potential and a ground potential.

33. The method of claim 26 wherein the supplying and altering steps comprise activating a current mirror when the filter output voltage reaches one of the fixed magnitudes.

* * * * *